(12) United States Patent
Hong

(10) Patent No.: US 7,589,021 B2
(45) Date of Patent: Sep. 15, 2009

(54) COPPER METAL INTERCONNECTION WITH A LOCAL BARRIER METAL LAYER

(75) Inventor: Ji Ho Hong, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 231 days.

(21) Appl. No.: 11/616,737

(22) Filed: Dec. 27, 2006

(65) Prior Publication Data

US 2007/0173061 A1    Jul. 26, 2007

(30) Foreign Application Priority Data

Dec. 28, 2005    (KR) ................ 10-2005-0131441

(51) Int. Cl.
*H01L 21/44* (2006.01)

(52) U.S. Cl. ................ 438/687; 438/637; 438/672

(58) Field of Classification Search ................ 438/622, 438/625–627, 631, 637, 638, 643, 645, 653, 438/672, 687; 257/750, 751, 752, 758, 762
See application file for complete search history.

(56) References Cited

U.S. PATENT DOCUMENTS

| | | | |
|---|---|---|---|
| 6,399,479 B1* | 6/2002 | Chen et al. | 438/628 |
| 6,734,559 B1* | 5/2004 | Yang et al. | 257/751 |
| 7,179,736 B2* | 2/2007 | Kwak et al. | 438/626 |
| 2002/0048926 A1* | 4/2002 | Konecni | 438/618 |
| 2002/0074234 A1* | 6/2002 | Dubin et al. | 205/182 |

* cited by examiner

*Primary Examiner*—Kevin M Picardat
(74) *Attorney, Agent, or Firm*—Sherr & Vaughn, PLLC

(57) ABSTRACT

Embodiments relate to a method of forming a copper metal interconnection in a semiconductor device using a damascene process. In embodiments, the method may include forming a damascene pattern in an interlayer dielectric layer on a semiconductor substrate, burying a copper plating layer in the damascene pattern using an ECP method, forming a recess on the copper plating layer buried in the damascene pattern, and forming a barrier metal layer in the recess. Since the barrier metal layer may be locally formed on the copper metal interconnection, it may be possible to prevent the diffusion of the copper although the size of the pattern is small.

5 Claims, 4 Drawing Sheets

COPPER METAL INTERCONNECTION WITH A LOCAL BARRIER METAL LAYER

The present application claims priority under 35 U.S.C. 119 and 35 U.S.C. 365 to Korean Patent Application No. 10-2005-0131441 (filed on Dec. 28, 2005), which is hereby incorporated by reference in its entirety.

BACKGROUND

Semiconductor manufacturing processes may be divided into a front end of the line (FEOL) process, which may include forming transistors on a silicon substrate, and a back end of the line (BEOL) process, which may include forming an interconnection. In a BEOL process, transistors may be connected to each other to create power supply and signal transmission paths that may form an integrated circuit on a silicon substrate.

For the BEOL process, copper (Cu), which may have high electro-migration (EM), may be used. However, since copper may not be easily etched and may be oxidized during a process, copper may not be easily patterned by a common photolithograph technology. As an alternative, to form a copper metal interconnection, a damascene process may be used. In a dual damascene process a via and a trench in an interlayer dielectric layer may first be formed on a substrate. Then, copper may be buried and may be planarized through a CMP processed.

FIGS. 1A to 1D illustrate a related art dual damascene process.

Referring to FIG. 1A, barrier insulating layer 14 may be formed in first interlayer dielectric layer 10 where a lower metal interconnection 12 may be formed. Barrier insulating layer 14 may function as an etch stop layer in the process of forming a damascene pattern on barrier insulating layer 14, and may include SiN and/or SiC. Second interlayer dielectric layer 16 may be formed on barrier insulating layer 14. After forming second interlayer dielectric layer 16, a damascene pattern, which may include via 16a and trench 16b, may be formed on second interlayer dielectric layer 16, and may use barrier insulating layer 14 as the etch stop layer. After removing a portion of barrier insulating layer 14 exposed by via 16a, barrier metal layer 18 may be formed on a surface (for example, the entire surface) of second interlayer dielectric layer 16. Barrier metal layer 18 may be uniformly deposited along the internal walls of via 16a and trench 16b.

Referring to FIG. 1B, copper seed layer 19 may be formed on barrier metal layer 18.

Referring to FIG. 1C, copper layer 20, which may fill via 16a and trench 16b, may be formed on copper seed layer 19, for sample by an electro-chemical plating (ECP).

Referring to FIG. 1D, copper layer 20 may be polished, for example by a CMP process, and insulating layer 16 may thereby be exposed to complete copper metal interconnection 22.

As described above, a multi-metal interconnection may be formed. A barrier insulating layer such as a silicon nitride layer or a silicon carbide may be formed on the formed metal interconnections. The barrier insulating layer may prevent copper ions from diffusing into the interlayer dielectric layer from a copper plating layer formed as the metal interconnection and may also function as an etch stop layer when a damascene pattern for the metal interconnection may be formed. The barrier insulating layer may be non-selectively formed on an entire surface of a substrate after the metal interconnection may be formed.

However, because a device may be highly integrated, a size of a pattern may be significantly reduced. Therefore, the non-selectively formed barrier insulating layer may not sufficiently to prevent diffusion. That is, it may be beneficial for the barrier insulating layer to be uniformly formed, and this may be beneficial for the metal interconnection having a minute pattern. However, uniformity may degrade in the process of forming the barrier insulating layer. In this instance, a diffusion path of copper may be generated. Therefore, reliability of the copper interconnection may be diminished and the performance of a resulting device may degraded.

SUMMARY

Embodiments relate to a method of forming a metal interconnection in a semiconductor device. Embodiments relate to a method of forming a copper metal interconnection by using a damascene process.

Embodiments relate to a method of locally forming a barrier metal layer on a copper metal interconnection formed in a damascene pattern that may prevent copper from being diffused.

According to embodiments, a method of forming a copper metal interconnection may include forming a damascene pattern in an interlayer dielectric layer on a semiconductor substrate, burying a copper plating layer in the damascene pattern using an ECP method, forming a recess on the copper plating layer buried in the damascene pattern, and forming a barrier metal layer in the recess.

In embodiments, forming the recess may be performed by a deplating process of applying back current to the substrate in the ECP process for forming the copper plating layer. In embodiments, forming the barrier metal layer may include forming the barrier metal layer on the substrate and planarizing the entire surface of the substrate to remove a part of the barrier metal layer formed on the interlayer dielectric layer. The barrier metal layer may be locally formed on the copper plating layer buried in the damascene pattern. The barrier metal layer may include at least one selected from the group consisting of Ta, TaN, a double layer of TaN/Ta, TaSiN, Ru, TiSiN, and WNx.

In embodiments, the semiconductor device including the copper metal interconnection may include a barrier metal layer locally formed on the copper metal interconnection to prevent the diffusion of copper (Cu).

DETAILED DESCRIPTION OF EMBODIMENTS

Figure 1A:
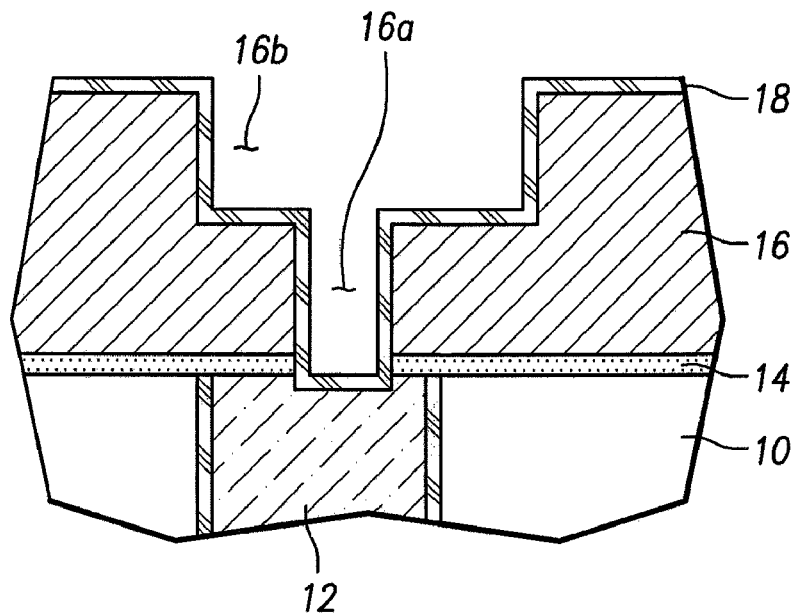
FIGS. 1A to 1D are example diagrams illustrating a related art method of forming a copper metal interconnection using a dual damascene process.
Figure 1B:
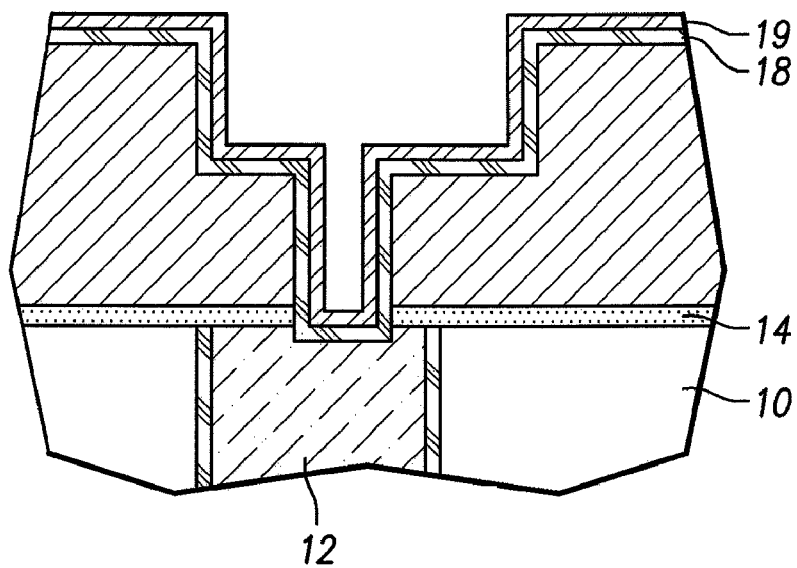
Figure 1C:
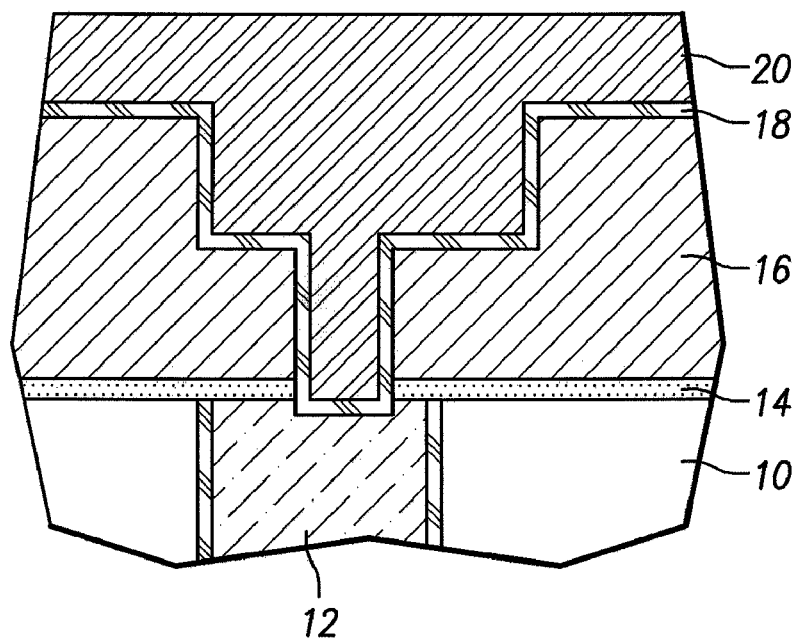
Figure 1D:
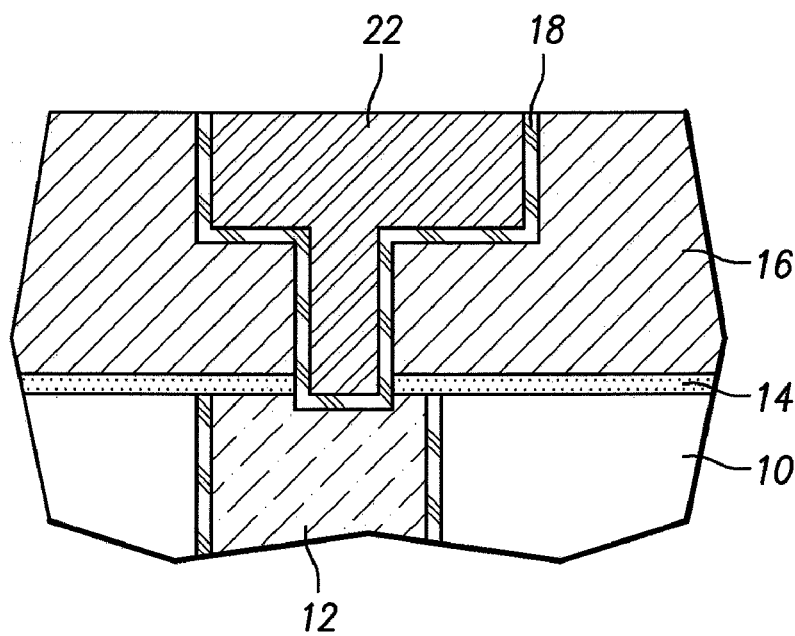
Figure 2A:
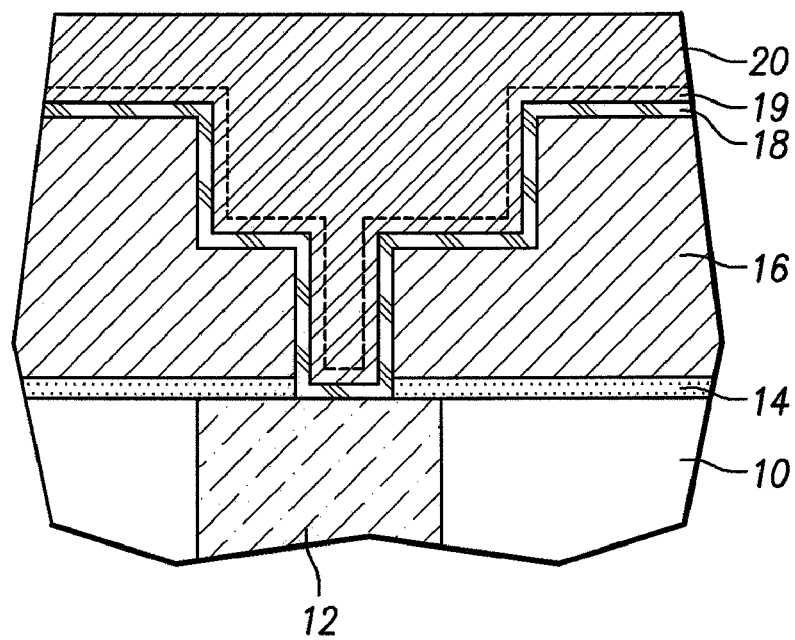
FIGS. 2A to 2D are example diagrams illustrating a method of forming a copper metal interconnection using a damascene process according to embodiments.

Referring to FIG. 2A, copper plating layer 20 may be formed in a damascene pattern formed in interlayer dielectric layer 16, for example using an electro-chemical plating (ECP) method. Since a process of forming a damascene pattern in interlayer dielectric layer 16 and a process of forming barrier metal layer 18 formed of a Ta layer or a double layer of Ta/TaN and a copper seed layer 19 may be similar to a related art method described with reference to FIGS. 1A and 1B, a description thereof will be omitted.

In embodiments, in a common damascene process, among damascene patterns formed on a substrate, the narrow patterns may be buried faster than a wide pattern. In other words, in embodiments the narrow patterns may be filled with a metal layer (including copper) faster than the wide patterns. Therefore, additional plating may be performed. This may ensure that the wide patterns, which may be filled at a relatively low speed, may be sufficiently filled. Such additional plating may be referred to as bulk plating. In embodiments, the plating layer that may be thickly formed on a surface of interlayer dielectric layer 16 may be referred to as a bulk plating layer.

FIG. 2A illustrates that the bulk plating may be performed. After the bulk plating may be performed to some degree, for example so that all of the damascene patterns are filled, back current may flow from a plating chamber to a substrate, and deplating may thereby be performed. If a deplating process is performed, copper atoms may deviate from the copper plating layer formed on the substrate. Therefore, a thickness formed on a surface of interlayer dielectric layer 16 may be gradually reduced.

Figure 2B:
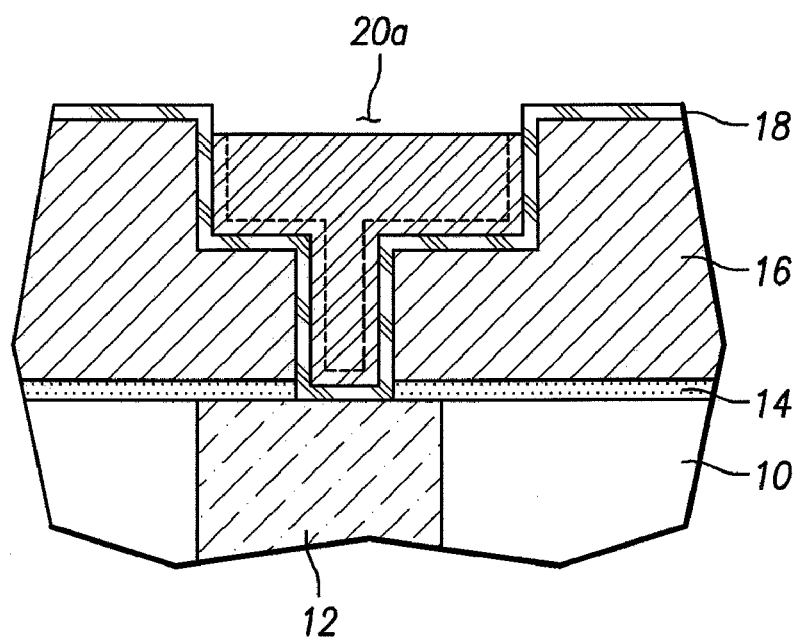

Referring to FIG. 2B, the deplating process may be performed until recess 20a may be formed on the copper metal layer buried in the damascene pattern to a prescribed depth.

Figure 2C:
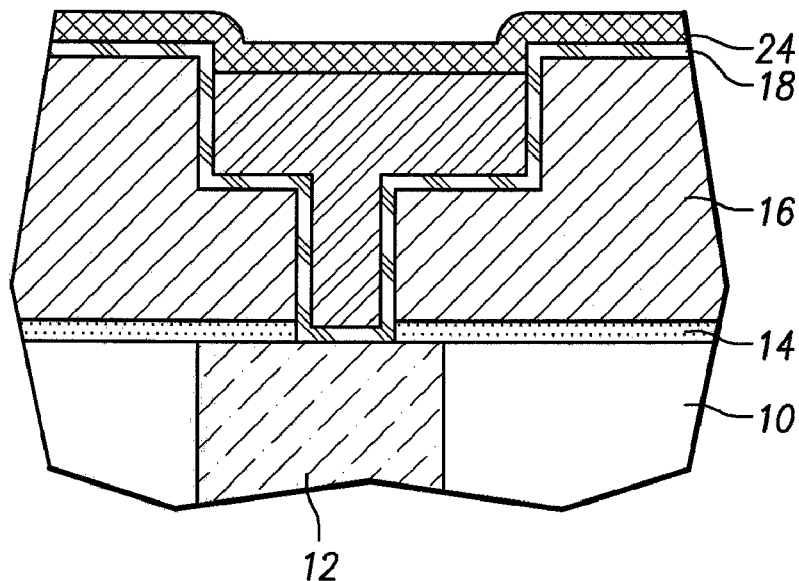

Referring to FIG. 2C, after forming recess 20a, which may be formed of the top surface of copper plating layer 20 and the side walls of interlayer dielectric layer 16 (which may include barrier layer 18), barrier metal layer 24 may be formed on a surface (for example, the entire surface) of the substrate. Barrier metal layer 24 may be formed of at least one of tantalum (Ta), tantalum nitride (TaN), ruthenium (Ru), the double layer of TaN/Ta, titanium silicon nitride (TiSiN), tantalum silicon nitride (TaSiN), and tungsten nitride (WNx). Also, barrier metal layer 24 may be formed using a physical vapor deposition (PVD) method, a chemical vapor deposition (CVD) method, and an atomic layer deposition (ALD) method.

Figure 2D:
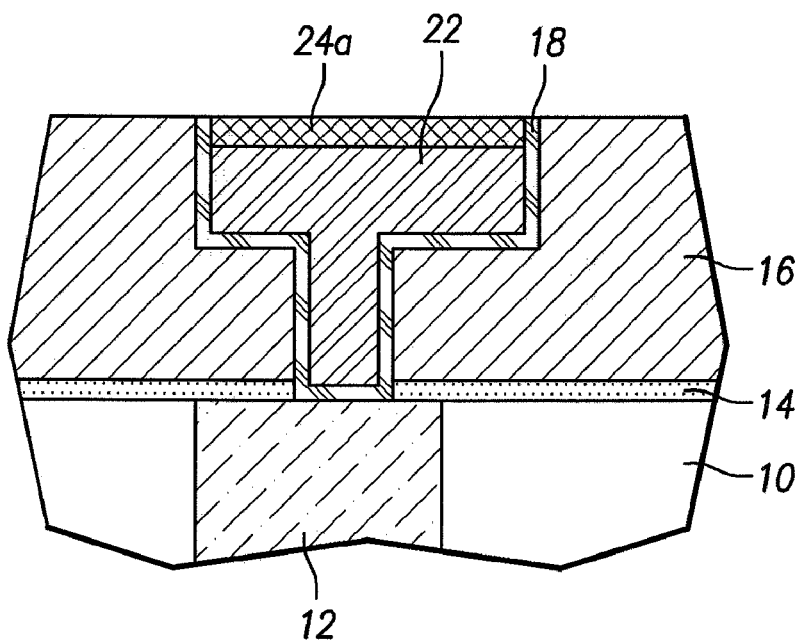

Referring to FIG. 2D, the substrate may be planarized, for example by a chemical mechanical polishing (CMP) method. Through the CMP process, a part of barrier metal layer 24 and a part of barrier metal layer 18, which may have been formed on interlayer dielectric layer 16, may be simultaneously removed. As a result, a copper metal interconnection 22 may be formed in the damascene pattern and a local barrier metal layer 24a formed in recess 20a formed on the top of copper metal interconnection 22 may be formed.

In embodiments, after forming the copper metal interconnection, to prevent the copper from being diffused, the barrier insulating layer, such as a silicon nitride layer and silicon carbide, may be formed on a surface of interlayer dielectric layer 16. However, when the size of the pattern is small, it may not be possible to effectively prevent the diffusion of the copper only by the barrier insulating layer. On the other hand, in the case of local barrier insulating layer 24a locally formed on copper interconnection 22, when the size of the pattern is small, it may not be possible to effectively prevent the diffusion of the copper. After the local barrier insulating layer 24a may be formed, the commonly used barrier insulating layer (such as a silicon nitride layer) may be formed on interlayer dielectric layer 16 to be used the etching stop layer for the damascene pattern of the metal interconnection.

According to embodiments, a barrier metal layer may be locally formed on the copper metal interconnection formed in the damascene pattern and may prevent diffusion of the copper. Therefore, the reliability of the copper metal interconnection may be improved. Also, according to embodiments, the local barrier metal layer may be formed using the deplating of the ECP. According to embodiments, a complicated processes may not be necessary. According to embodiments, it may be possible to increase the effectiveness of a process. A method of forming the copper metal interconnection according to embodiments may be applied to a single damascene process as well as to a dual damascene process.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
   forming a damascene pattern in an interlayer dielectric layer over a semiconductor substrate;
   forming a copper plating layer in the damascene pattern by performing an electrochemical plating (ECP), wherein the copper plating layer being thickly formed on a surface of the interlayer dielectric layer;
   forming a recess in the damascene pattern by performing a deplating process of apply back current to the substrate; and
   forming a barrier metal layer in the recess over the copper plating layer.

2. The method of claim 1, wherein forming the barrier metal layer comprises:
   forming the barrier metal layer over the interlayer dielectric layer, including over the recess; and
   planarizing a surface of the substrate to remove a part of the barrier metal layer formed over the interlayer dielectric layer to expose the interlayer dielectric layer.

3. The method of claim 2, wherein the barrier metal layer comprises at least one of Ta, TaN, a double layer of TaN/Ta, TaSiN, Ru, TiSiN, and WNx.

4. The method of claim 1, wherein the barrier metal layer is formed locally over the copper plating layer formed in the damascene pattern.

5. The method of claim 1, wherein the barrier metal layer comprises at least one of Ta, TaN, a double layer of TaN/Ta, TaSiN, Ru, TiSiN, and WNx.

* * * * *